United States Patent
Takahashi

(10) Patent No.: US 11,476,096 B2
(45) Date of Patent: Oct. 18, 2022

(54) WAFER SUPPORT TABLE

(71) Applicant: NGK INSULATORS, LTD., Nagoya (JP)

(72) Inventor: Tomohiro Takahashi, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 199 days.

(21) Appl. No.: 16/526,049

(22) Filed: Jul. 30, 2019

(65) Prior Publication Data

US 2019/0355556 A1 Nov. 21, 2019

Related U.S. Application Data

(63) Continuation of application No. PCT/JP2018/007542, filed on Feb. 28, 2018.

(60) Provisional application No. 62/467,430, filed on Mar. 6, 2017.

(51) Int. Cl.
*H01J 37/32* (2006.01)
*H01L 21/67* (2006.01)
*H01L 21/683* (2006.01)

(52) U.S. Cl.
CPC .. *H01J 37/32541* (2013.01); *H01J 37/32082* (2013.01); *H01J 37/32715* (2013.01); *H01J 37/32724* (2013.01); *H01L 21/67103* (2013.01); *H01L 21/6833* (2013.01)

(58) Field of Classification Search
None
See application file for complete search history.

(56) References Cited

U.S. PATENT DOCUMENTS

| | | | |
|---|---|---|---|
| 2003/0089600 A1 | 5/2003 | Natsuhara et al. | |
| 2006/0191639 A1* | 8/2006 | Tanaka | H01L 21/67103 156/345.52 |
| 2007/0044914 A1* | 3/2007 | Matano | H01J 21/6833 156/345.24 |
| 2008/0017111 A1 | 1/2008 | Ishisaka et al. | |

(Continued)

FOREIGN PATENT DOCUMENTS

| CN | 1868031 A | 11/2006 |
|---|---|---|
| CN | 103069550 A | 4/2013 |

(Continued)

OTHER PUBLICATIONS

English Machine Translation of Ito (JP2005018992A) retrieved from ESPACENET Apr. 21, 2021 (Year: 2021).*

(Continued)

*Primary Examiner* — Ram N Kackar
*Assistant Examiner* — Laureen Chan
(74) *Attorney, Agent, or Firm* — Burr & Brown, PLLC

(57) ABSTRACT

A wafer support table in which an RF electrode and a heater electrode are buried inside a circular-plate-shaped ceramic substrate having a wafer placing surface in this order from a wafer placing surface side, wherein the RF electrode is constituted by a plurality of RF zone electrodes provided in respective zones on an identical plane, and the plurality of RF zone electrodes and the heater electrode are independently connected to a plurality of conductors for RF zone electrode and a conductor for heater electrode that are provided on an outer side of a surface of the ceramic substrate opposite to the wafer placing surface.

6 Claims, 12 Drawing Sheets

(56) References Cited

U.S. PATENT DOCUMENTS

| | | | |
|---|---|---|---|
| 2010/0163188 A1* | 7/2010 | Tanaka | H01L 21/68792 156/345.52 |
| 2011/0096461 A1* | 4/2011 | Yoshikawa | H01L 21/6833 361/234 |
| 2012/0103970 A1 | 5/2012 | Lubomirsky et al. | |
| 2012/0164834 A1* | 6/2012 | Jennings | H01J 37/32532 438/694 |
| 2015/0194326 A1 | 7/2015 | Zhou et al. | |
| 2017/0040198 A1* | 2/2017 | Lin | H01L 21/68735 |
| 2019/0088517 A1* | 3/2019 | Kosakai | H01L 21/67248 |

FOREIGN PATENT DOCUMENTS

| | | |
|---|---|---|
| CN | 106449503 A | 2/2017 |
| JP | 2003-160874 A1 | 6/2003 |
| JP | 2005018992 A * | 1/2005 |
| JP | 2005-197391 A1 | 7/2005 |
| JP | 2011-119654 A1 | 6/2011 |
| JP | 2012-089694 A1 | 5/2012 |
| JP | 2012089694 A * | 5/2012 |
| JP | 5896595 B2 | 3/2016 |
| KR | 10-2011-0046301 A | 5/2011 |
| TW | 201527586 A | 7/2015 |
| WO | 2005/093 806 A1 | 10/2005 |
| WO | 2016/080502 A1 | 5/2016 |

OTHER PUBLICATIONS

English Machine Translation of Kimura (JP2012089694A) retrieved from ESPACENET Apr. 21, 2021 (Year: 2021).*
English Translation of International Preliminary Report on Patentability (Chapter I) (Application No. PCT/JP2018/007542) dated Sep. 19, 2019, 7 pages.
International Search Report and Written Opinion (Application No. PCT/JP2018/007542) dated Apr. 24, 2018.
Korean Office Action (Application No. 10-2019-7024977) dated Jun. 16, 2020 (with English translation).
Taiwanese Office Action, Taiwanese Application No. 11020750420, dated Aug. 4, 2021 (5 pages).
Chinese Office Action, Chinese Application No. 201880009006.1, dated Aug. 29, 2022 (8 pages).

* cited by examiner

WAFER SUPPORT TABLE

This application is based on and claims priority of U.S. Provisional Patent Application No. 62/467,430, filed on Mar. 6, 2017, the entire contents of which are incorporated herein by reference.

BACKGROUND OF THE INVENTION

1. Field of the Invention

The present invention relates to a wafer support table.

2. Description of the Related Art

A wafer support table configured such that an RF electrode and a heater electrode are buried inside a circular-plate-shaped ceramic substrate having a wafer placing surface in this order from a wafer placing surface side is known. For example, Patent Literature 1 discloses, as this kind of wafer support table, a wafer support table including a circular RF electrode and an annular RF electrode that are buried inside a ceramic substrate at different depths from a wafer mounting surface. A flat-plate upper electrode is disposed so as to face the wafer placing surface of this wafer support table. Plasma is generated by applying high-frequency power across parallel flat-plate electrodes that are the flat-plate upper electrode and the RF electrodes of the wafer support table. According to the descriptions in Patent Literature 1, a plasma density distribution can be controlled so that the plasma density distribution becomes good by applying different levels of high-frequency power to the circular RF electrode and the annular RF electrode when generating plasma.

CITATION LIST

Patent Literature

PTL 1: Japanese Patent No. 5896595

SUMMARY OF THE INVENTION

However, during generation of plasma, a distance between the flat-plate upper electrode and the circular RF electrode and a distance between the flat-plate upper electrode and the annular RF electrode are different, and a thickness of a dielectric layer (ceramic substrate) between the wafer placing surface and the circular RF electrode and a thickness of a dielectric layer between the wafer placing surface and the annular RF electrode are also different. It is therefore conventionally difficult to control a plasma density distribution so that the plasma density distribution becomes good.

The present invention was attained in view of such a problem, and an object of the present invention is to easily control a plasma density distribution.

In order to accomplish at least one of the above objects, a wafer support table of the present invention employs the following configuration.

That is, a wafer support table of the present invention is a wafer support table in which an RF electrode and a heater electrode are buried inside a circular-plate-shaped ceramic substrate having a wafer placing surface in this order from a wafer placing surface side, wherein the RF electrode is constituted by a plurality of RF zone electrodes provided in respective zones on an identical plane, and the plurality of RF zone electrodes and the heater electrode are independently connected to a plurality of conductors for RF zone electrode and a conductor for heater electrode that are provided on an outer side of a surface of the ceramic substrate opposite to the wafer placing surface.

In this wafer support table, the plurality of RF zone electrodes and the heater electrode are independently connected to a plurality of conductors for RF zone electrode and a conductor for heater electrode that are provided on an outer side of a surface of the ceramic substrate opposite to the wafer placing surface. Accordingly, different levels of high-frequency power can be supplied to the RF zone electrodes, and therefore a plasma density distribution can be controlled so that the plasma density distribution becomes good. The RF electrode is constituted by a plurality of RF zone electrodes provided in respective zones on an identical plane. Accordingly, all distances of the RF zone electrodes from a flat-plate upper electrode disposed above the wafer support table are the same, and all thicknesses of the ceramic substrate (thicknesses of a dielectric layer) between the wafer placing surface and the RF zone electrodes are also the same. It is therefore possible to easily control a plasma density distribution so that the plasma density distribution becomes good. Note that the shape and the number of RF zone electrodes are not limited in particular.

The wafer support table according to the present invention may be configured such that as the plurality of RF zone electrodes, the RF electrode includes a circular electrode that is concentric with the ceramic substrate or a plurality of electrodes into which the circular electrode is divided and further includes one or more annular electrodes that are concentric with the ceramic substrate and are provided on a circumference of the circular electrode or a plurality of electrodes into which at least one of the annular electrodes is divided. Since a plasma density distribution in an inner circumferential part of the ceramic substrate and a plasma density distribution in an outer circumferential part of the ceramic substrate are different in many cases, it is preferable to divide the RF electrode into a circular electrode (or a plurality of electrodes into which the circular electrode is divided) and one or more annular electrodes (or a plurality of electrodes into which the annular electrode is divided). For example, a circular electrode that is concentric with the ceramic substrate and one or more annular electrodes that are concentric with the ceramic substrate and are provided on a circumference of the circular electrode may be provided as the RF zone electrodes. Alternatively, a pair of semi-circular electrodes obtained by dividing the circular electrode that is concentric with the ceramic substrate into halves and one or more annular electrodes that are concentric with the ceramic substrate and are provided on an outer side of the semi-circular electrodes may be provided. Alternatively, the annular electrode may be divided into a plurality of electrodes.

The wafer support table may be configured to include a hollow ceramic shaft joined to a central region of the surface of the ceramic substrate opposite to the wafer placing surface, wherein the plurality of conductors for RF zone electrode and the conductor for heater electrode are disposed inside the ceramic shaft; among the plurality of RF zone electrode, an RF zone electrode that is provided outside a central region in which the ceramic shaft is projected onto the ceramic substrate is connected to a corresponding one of the plurality of conductors for RF zone electrode through a jumper; and the jumper is provided inside the ceramic substrate on a plane farther away from the wafer placing surface than the plane on which the RF electrodes are provided. With this configuration, the RF zone electrode provided outside the central region of the ceramic substrate can be wired to a corresponding one of the conductors for RF zone electrode by using a jumper. In this case, two or more RF zone electrodes among the plurality of RF zone electrodes may be provided outside the central region; and the jumpers provided for the respective two or more RF zone electrodes may be provided on an identical plane. With this configuration, a thickness of the ceramic substrate is smaller than in a case where the jumpers are provided at different depths. In a case where the thickness of the ceramic substrate is small, a heat capacity of the ceramic substrate becomes small. This makes it possible to speedily adjust a temperature of the ceramic substrate and a temperature of a wafer. Furthermore, the jumper may be provided on a plane on which the heater electrode is provided so as not to be in contact with the heater electrode. With this configuration, it is possible to make the thickness of the ceramic substrate small.

The wafer support table of the present invention may be configured such that the heater electrode is constituted by a same number of plural heater zone electrodes as the number of RF zone electrodes or a different number of plural heater zone electrodes from the number of RF zone electrodes; and the conductor for heater electrode is constituted by conductors for heater zone electrode independently connected to the respective plural heater zone electrodes. With this configuration, different levels of electric power can be supplied to the heater zone electrodes, and therefore a variation in film formation properties between zones can be compensated and adjusted by adjustment of a heater temperature. In this case, at least one of the heater zone electrodes may be disposed in a gap between the RF zone electrodes when the ceramic substrate is viewed from the wafer placing surface. In a case where applied RF electric power is large, making the gap large can suppress RF interference and is therefore advantageous but sometimes decreases a plasma density in a part of the gap in which no RF electrode is present, thereby making an in-plane plasma density uneven. In view of this, by disposing a heater zone electrode in the region of the gap, a variation in film formation properties that occurs due to unevenness in plasma density can be compensated and adjusted by adjustment of a temperature distribution, i.e., a heater temperature, and therefore this configuration is effective. Alternatively, the plurality of RF zone electrodes and the plurality of heater zone electrodes match each other when the ceramic substrate is viewed from the wafer placing surface. With this configuration, temperatures of the RF zone electrodes can be individually controlled by corresponding heater zone electrodes.

DETAILED DESCRIPTION OF THE INVENTION

Figure 1:
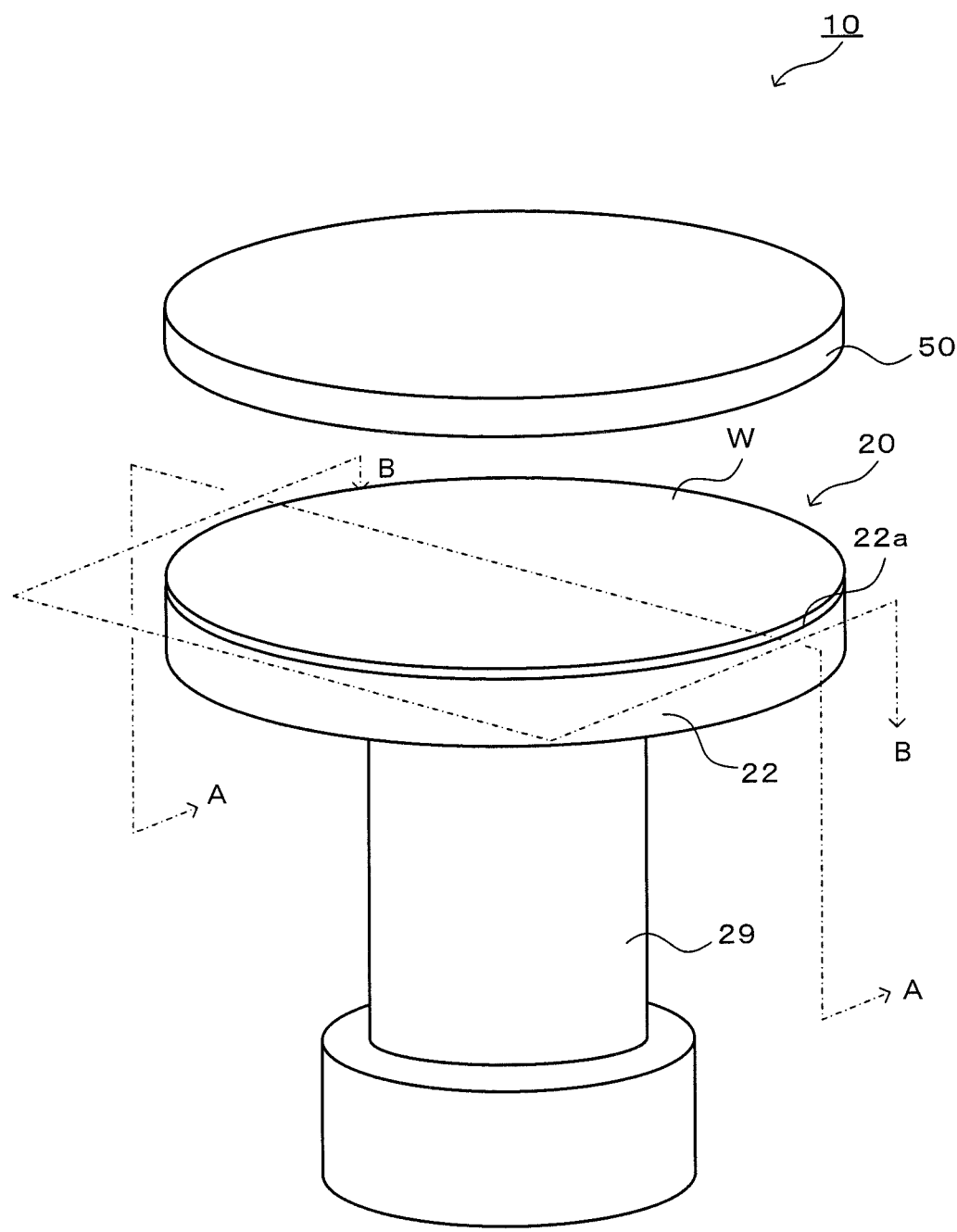
FIG. 1 is a perspective view illustrating an outline configuration of a plasma generating device 10.
Figure 3:
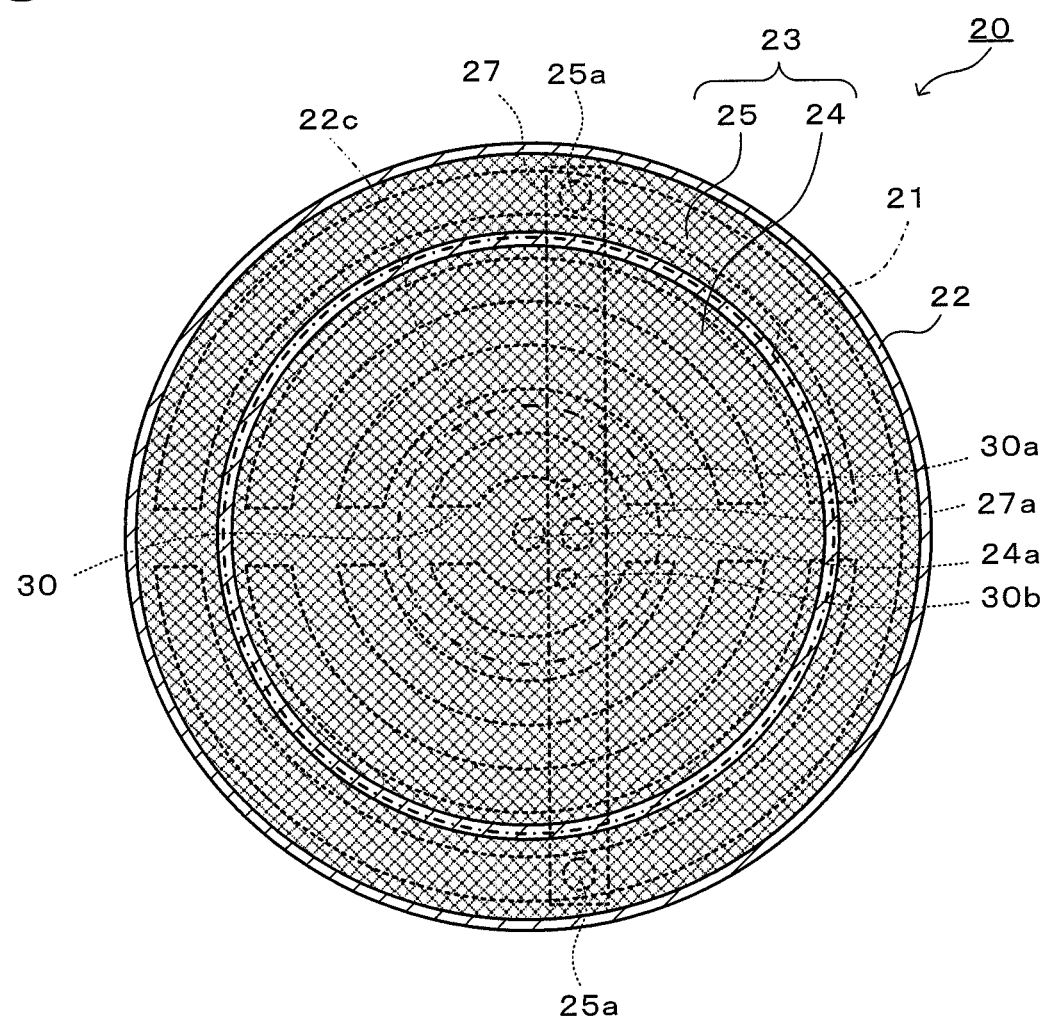
FIG. 3 is a cross-sectional view taken along line B-B in FIG. 1.
Figure 4:
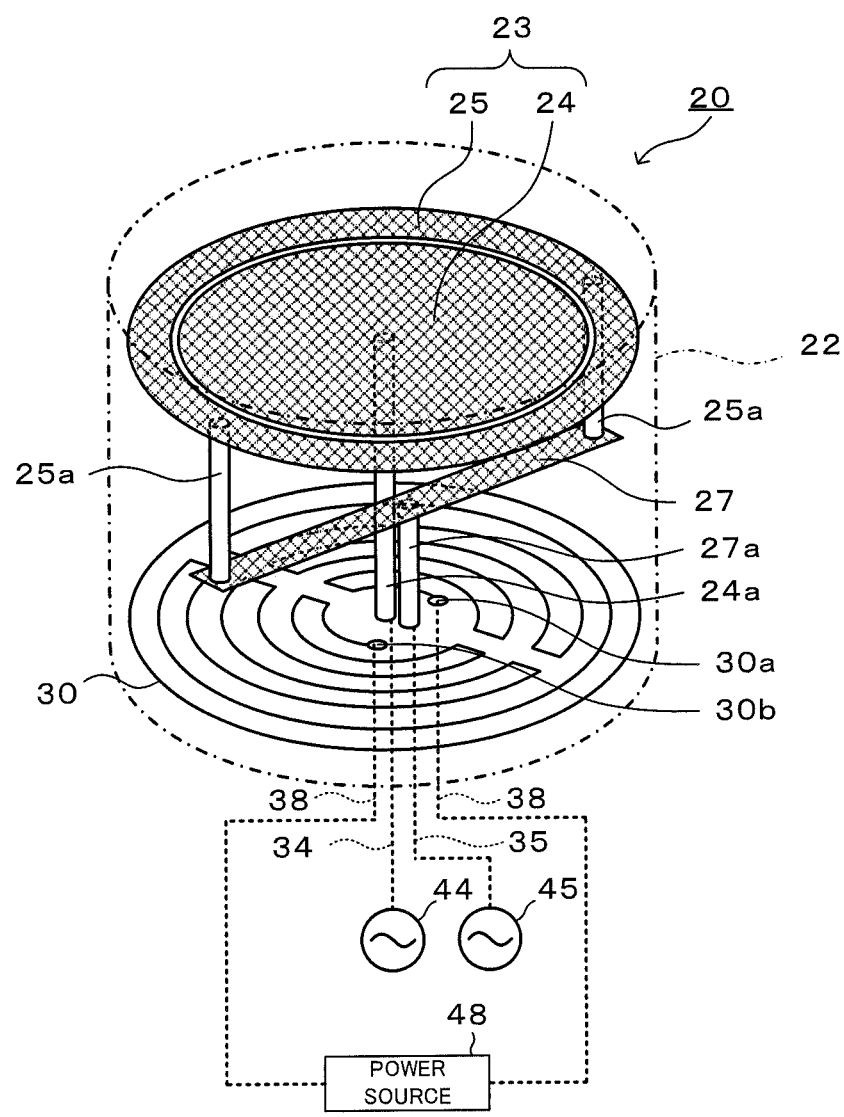
FIG. 4 is a perspective view illustrating a way in which an RF electrode 23, a jumper 27, and a heater electrode 30 are disposed.

A preferred embodiment of the present invention is described below with reference to the drawings. FIG. 1 is a perspective view of a plasma generating device 10, FIG. 2 is a cross-sectional view taken along line A-A in FIG. 1, FIG. 3 is a cross-sectional view taken along line B-B in FIG. 1, and FIG. 4 is a perspective view illustrating a way in which an RF electrode 23, a jumper 27, and a heater electrode 30 are disposed.

As illustrated in FIG. 1, the plasma generating device 10 includes a wafer support table 20 and an upper electrode 50.

The wafer support table 20 is used to support and heat a wafer W on which CVD, etching, or the like is performed by using plasma and is attached inside a chamber for a semiconductor process (not illustrated). This wafer support table 20 includes a ceramic substrate 22 and a hollow ceramic shaft 29.

Figure 2:
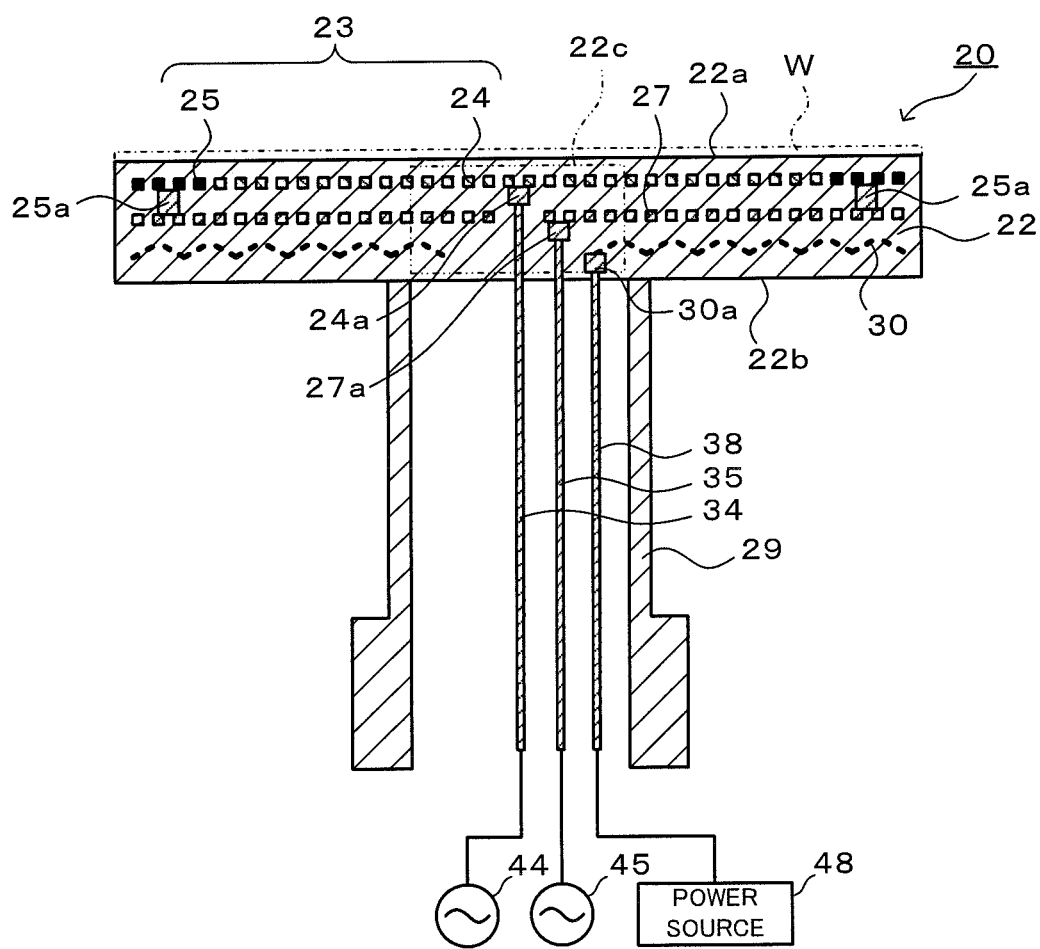
FIG. 2 is a cross-sectional view taken along line A-A in FIG. 1.

As illustrated in FIG. 2, the ceramic substrate 22 is a circular-plate-shaped member made of ceramic (e.g., alumina or aluminum nitride). This ceramic substrate 22 includes a wafer placing surface 22a on which the wafer W can be placed. The ceramic shaft 29 is joined to a center of a surface (rear surface) 22b of the ceramic substrate 22 opposite to the wafer placing surface 22a. As illustrated in FIGS. 2 through 4, the RF electrode 23, the jumper 27, and the heater electrode 30 are buried in the ceramic substrate 22 so as to be away from one another. The RF electrode 23, the jumper 27, and the heater electrode 30 are buried in this order from a side close to the wafer placing surface 22a.

The RF electrode 23 is provided in parallel (including "substantially parallel", the same applies hereinafter) with the wafer placing surface 22a. The RF electrode 23 is constituted by a first RF zone electrode 24 provided in a zone on an inner side of a circle 21 (see FIG. 3) having a predetermined radius (which is a half or more of a radius of the ceramic substrate 22) from a center of the ceramic substrate 22 and a second RF zone electrode 25 provided in a zone on an outer side of the circle 21. The first RF zone electrode 24 is a circular electrode that is concentric with the ceramic substrate 22. The second RF zone electrode 25 is an annular electrode that is provided away from the first RF zone electrode 24 on an outer side of the first RF zone electrode 24 and is concentric with the ceramic substrate 22. The first RF zone electrode 24 is provided so as to overlap a circular central region 22c (the line with alternate long and two short dashes in FIGS. 2 and 3) in which the ceramic shaft 29 is projected onto the ceramic substrate 22, but the second RF zone electrode 25 is provided outside the central region 22c. Each of the first and second RF zone electrodes 24 and 25 is an electrically-conductive mesh sheet.

As illustrated in FIG. 2, an electrode terminal 24a is connected to a center of a rear surface of the first RF zone electrode 24. The electrode terminal 24a is provided so as to be exposed to an outside from the rear surface 22b of the ceramic substrate 22. The first RF zone electrode 24 is connected to a conductor for first RF zone electrode 34 through the electrode terminal 24a. The conductor for first RF zone electrode 34 is connected to a first alternating-current power source 44 through a hollow inner part and a lower opening of the ceramic shaft 29.

As illustrated in FIG. 2, the second RF zone electrode 25 is connected to a conductor for second RF zone electrode 35 corresponding to the second RF zone electrode 25 through the jumper 27. Specifically, upper ends of inner terminals 25a having a columnar shape are connected to two points slightly deviated from a diametrical direction on a rear surface of the second RF zone electrode 25. The jumper 27 is an electrically-conductive band-shaped mesh sheet parallel with the wafer placing surface 22a and is disposed between the RF electrode 23 and the heater electrode 30 in the ceramic substrate 22 so as not to interfere with the electrode terminal 24a and the conductor for first RF zone electrode 34. An electrode terminal 27a is connected to a center of a rear surface of the jumper 27. The electrode terminal 27a is provided so as to be exposed to an outside from the rear surface 22b of the ceramic substrate 22. The jumper 27 is connected to the conductor for second RF zone electrode 35 through the electrode terminal 27a. The conductor for second RF zone electrode 35 is connected to a second alternating-current power source 45 through the hollow inner part and the lower opening of the ceramic shaft 29.

The heater electrode 30 is provided in parallel with the wafer placing surface 22a. The heater electrode 30 is a coil wired, like a line drawn with one stroke, within a circle whose diameter is slightly smaller than a diameter of the ceramic substrate 22 from an electrode terminal 30a that is one of two electrode terminals 30a and 30b disposed close to a center of the circle to the electrode terminal 30b that is the other one of the two electrode terminals 30a and 30b throughout an almost entire surface of the circle. The electrode terminals 30a and 30b are connected to a power source 48 through respective wiring members 38 (conductors for heater electrode).

The RF electrode 23, the jumper 27, and the heater electrode 30 may be made of the same material or may be made of different materials. The material is not limited in particular as long as the material has electric conductivity, and examples of the material include Mo, W, Nb, an Mo compound, a W compound, and an Nb compound. Among these materials, a material whose difference in coefficient of thermal expansion from the ceramic substrate 22 is small is preferably used.

The ceramic shaft 29 is a cylindrical member made of the same ceramic as the ceramic substrate 22. An upper end surface of the ceramic shaft 29 is joined to the rear surface 22b of the ceramic substrate 22 by diffusion joining or thermal compression bonding (TCB). TCB is a known method of sandwiching a metal joint material between two members to be joined and then pressure-joining the two members in a state where the members are heated to a solidus temperature of the metal joint material or lower.

As illustrated in FIG. 1, the upper electrode 50 is fixed at an upper position (e.g., on a ceiling surface of the chamber (not illustrated)) that faces the wafer placing surface 22a of the ceramic substrate 22. This upper electrode 50 is connected to the ground.

Next, an example of use of the plasma generating device 10 is described. The plasma generating device 10 is placed in a chamber (not illustrated), and the wafer W is placed on the wafer placing surface 22a. Then, high-frequency power is supplied from the first alternating-current power source 44 to the first RF zone electrode 24, and high-frequency power is supplied from the second alternating-current power source 45 to the second RF zone electrode 25. This generates plasma between parallel flat-plate electrodes that are the upper electrode 50 and the RF electrode 23 buried in the ceramic substrate 22. CVD film formation, etching, or the like is performed on the wafer W by using the plasma. A temperature of the wafer W is found on the basis of a detection signal of a thermocouple (not illustrated), and a voltage applied to the heater electrode 30 is controlled so that the temperature becomes a preset temperature (e.g., 350° C. or 300° C.)

In the wafer support table 20 described in detail above, different levels of high-frequency power (e.g., electric power of the same frequency and different levels of wattage, electric power of different frequencies and the same level of wattage, or electric power of different frequencies and different levels of wattage) can be supplied to the first and second RF zone electrodes 24 and 25, and thus a plasma density distribution can be controlled so that the plasma density distribution becomes good. The first and second RF zone electrodes 24 and 25 are provided on an identical plane. Accordingly, all distances of the RF zone electrodes 24 and 25 from the upper electrode 50 disposed above the wafer support table 20 are the same, and all thicknesses of the ceramic substrate 22 (thicknesses of a dielectric layer) between the wafer placing surface 22a and the RF zone electrodes 24 and 25 are also the same. It is therefore possible to easily control a plasma density distribution so that the plasma density distribution becomes good.

Furthermore, since a plasma density distribution in an inner circumferential part of the ceramic substrate 22 and a plasma density distribution in an outer circumferential part of the ceramic substrate 22 are different in many cases, it is preferable to divide the RF electrode 23 into a circular electrode (the first RF zone electrode 24) on an inner circumferential side and an annular electrode (the second RF zone electrode 25) on an outer circumferential side as described above.

Furthermore, the second RF zone electrode 25 provided outside the central region 22c in which the ceramic shaft 29 is projected onto the ceramic substrate 22 can be wired to the conductor for RF zone electrode 35 corresponding to the second RF zone electrode 25 by using the jumper 27.

It is needless to say that the present invention is not limited to the above-described embodiment, and that the present invention can be implemented in other various embodiments insofar as falling within the technical scope of the invention.

Figure 5:
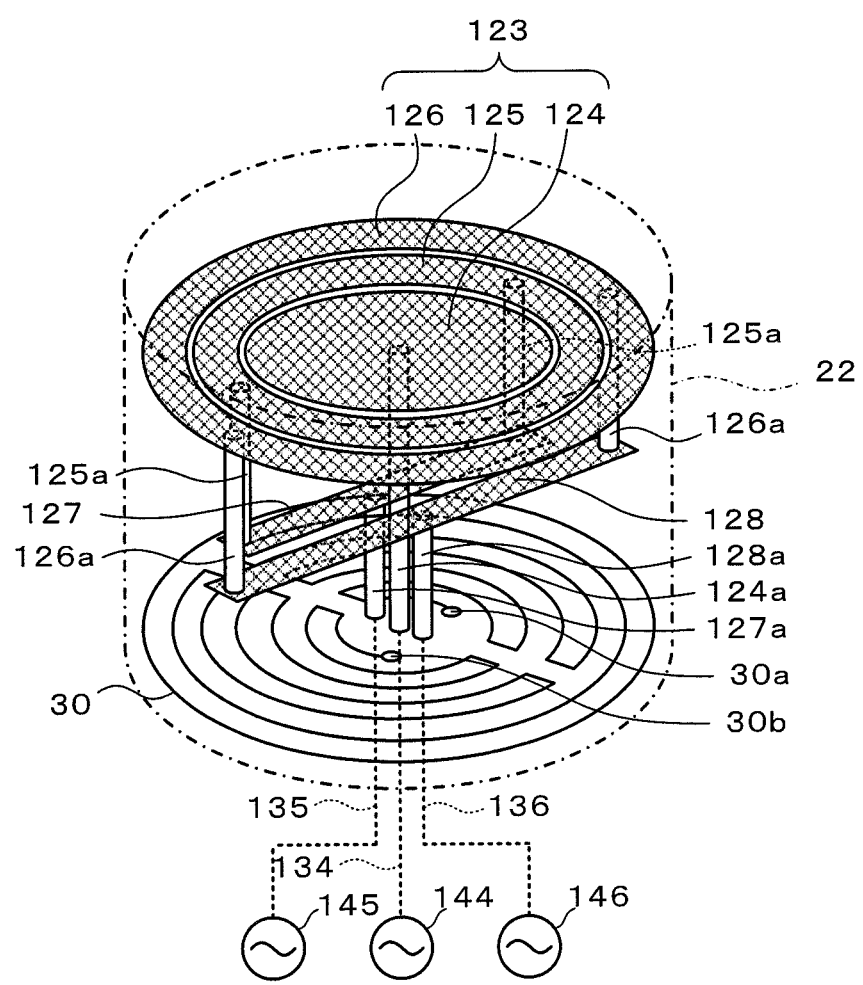
FIG. 5 is a perspective view illustrating a way in which an RF electrode 123, jumpers 127 and 128, and a heater electrode 30 are disposed.

For example, although the RF electrode 23 is constituted by the first and second RF zone electrodes 24 and 25 provided on an identical plane in the above embodiment, the RF electrode may be constituted by three or more RF zone electrodes provided on an identical plane. FIG. 5 illustrates an example in which an RF electrode 123 is constituted by first through third RF zone electrodes 124 through 126 provided on an identical plane. In FIG. 5, constituent elements identical to those in the above embodiment are given identical reference signs. In FIG. 5, wiring members 38 and a power source 48 for a heater 30 are omitted. The first RF zone electrode 124 is a circular electrode that is concentric with the ceramic substrate 22, and the second and third RF zone electrodes 125 and 126 are annular electrodes that are concentric with the ceramic substrate 22. The first RF zone electrode 124 is provided so as to overlap a circular central region 22c (the line with alternate long and two short dashes in FIGS. 2 and 3) in which a ceramic shaft 29 is projected onto a ceramic substrate 22. The first RF zone electrode 124 is connected to a conductor for first RF zone electrode 134 through an electrode terminal 124a connected to a center of a rear surface of the first RF zone electrode 124 and is further connected to a first alternating-current power source 144. The second and third RF zone electrodes 125 and 126 are provided outside the central region 22c. The second RF zone electrode 125 is connected to a jumper 127 through two inner terminals 125a, and the jumper 127 is connected to a conductor for second RF zone electrode 135 through an electrode terminal 127a and is further connected to a second alternating-current power source 145. The third RF zone electrode 126 is connected to a jumper 128 through two inner terminals 126a, and the jumper 128 is connected to a conductor for third RF zone electrode 136 through an electrode terminal 128a and is further connected to a third alternating-current power source 146. The two jumpers 127 and 128 are provided on an identical plane. A plane on which the two jumpers 127 and 128 are provided is located between a plane on which the RF electrode 123 is provided and a plane on which the heater electrode 30 is provided. According to the configuration of FIG. 5, effects similar to those in the above embodiment can be obtained. In particular, since different levels of high-frequency power can be supplied to the first through third RF zone electrodes 124 through 126, a plasma density distribution can be controlled so that the plasma density distribution becomes better. Since the jumpers 127 and 128 are provided on an identical plane, the thickness of the ceramic substrate 22 is smaller than that in a case where the jumpers 127 and 128 are provided at different depths. In a case where the thickness of the ceramic substrate 22 is small, a heat capacity of the ceramic substrate 22 becomes small. This makes it possible to speedily adjust a temperature of the ceramic substrate 22 and a temperature of a wafer.

Figure 6:
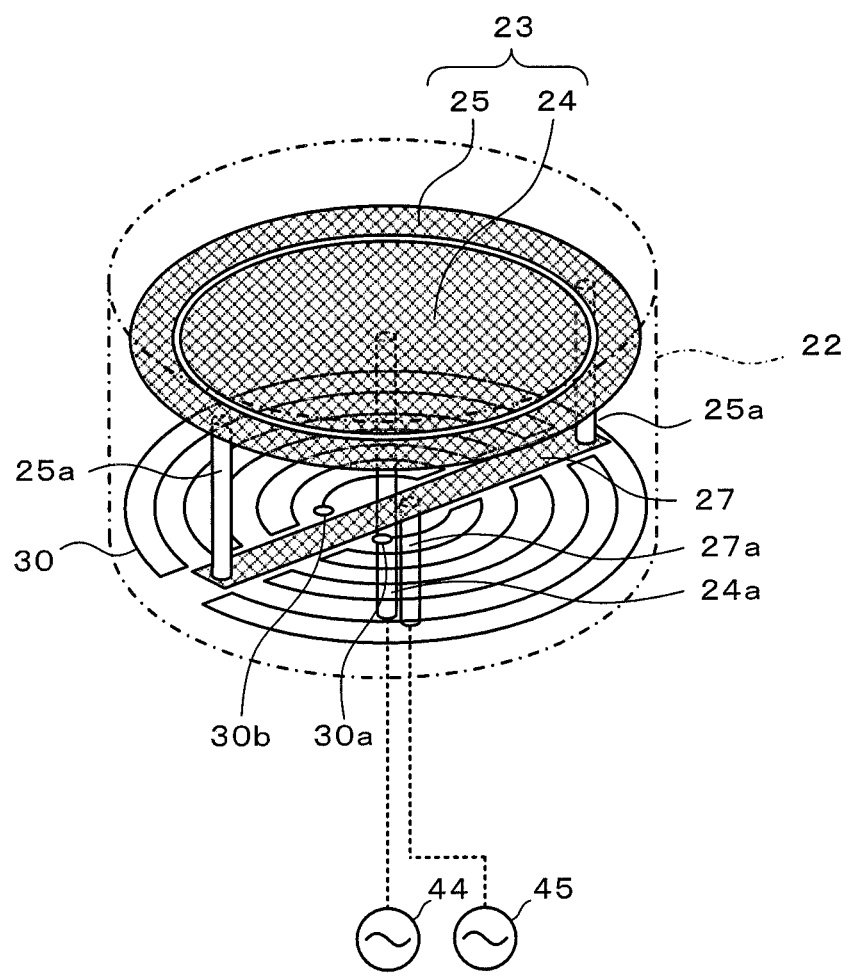
FIG. 6 is a perspective view illustrating another example of a way in which an RF electrode 23, a jumper 27, and a heater electrode 30 are disposed.

Although the jumper 27 and the heater electrode 30 are provided at different depths in the ceramic substrate 22 in the above embodiment, the jumper 27 and the heater electrode 30 may be provided on an identical plane in the ceramic substrate 22 as illustrated in FIG. 6. In FIG. 6, constituent elements identical to those in the above embodiment are given identical reference signs. In FIG. 6, wiring members 38 and a power source 48 for a heater 30 are omitted. With this configuration, the thickness of the ceramic substrate 22 can be further reduced.

Figure 7:
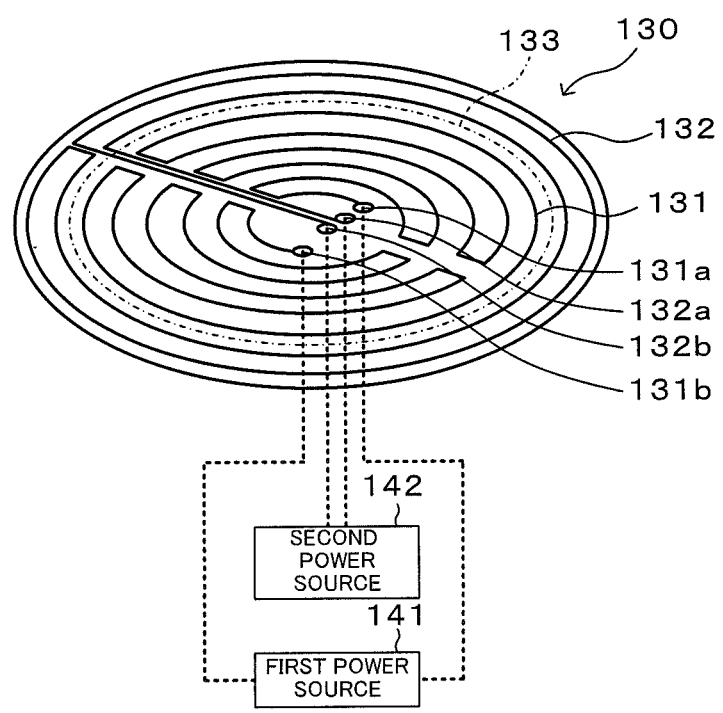
FIG. 7 is a perspective view of a heater electrode 130.

In the above embodiment, a heater electrode constituted by the same number of plural heater zone electrodes as the number of RF zone electrodes or a different number of plural heater zone electrodes from the number of RF zone electrodes may be used instead of the heater electrode 30. For example, a heater electrode 130 of FIG. 7 is constituted by a first heater zone electrode 131 provided in a circular zone on an inner side of a circle 133 having a predetermined radius (e.g., a half or more of a radius of the ceramic substrate 22) from a center of the ceramic substrate 22 and a second heater zone electrode 132 provided in an annular zone on an outer side of the circle 133. The first heater zone electrode 131 is a coil wired, like a line drawn with one stroke, from an electrode terminal 131a that is one of two electrode terminals 131a and 131b disposed close to a center of the ceramic substrate 22 to the electrode terminal 131b that is the other one of the two electrode terminals 131a and 131b throughout an almost entire surface of the circular zone. Each of the electrode terminals 131a and 131b is connected to a first power source 141 through a wiring member. The second heater zone electrode 132 is a coil that is wired, like a line drawn with one stroke, so as to extend from an electrode terminal 132a that is one of two electrode terminals 132a and 132b disposed close to the center of the ceramic substrate 22 to the annular zone and return to the electrode terminal 132b that is the other one of the two electrode terminals 132a and 132b after passing throughout an almost entire surface of the annular zone. Each of the electrode terminals 132a and 132b is connected to a second power source 142 through a wiring member. With the configuration, different levels of electric power can be supplied to the first and second heater zone electrodes 131 and 132, and therefore a variation in film formation properties between zones can be compensated and adjusted by adjustment of a heater temperature.

Figure 8:
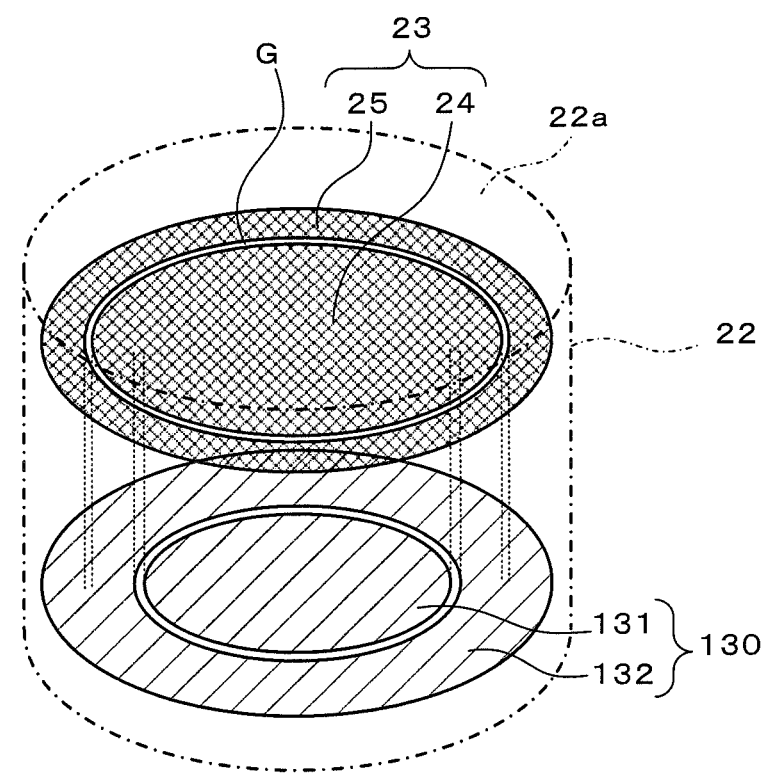
FIG. 8 is a perspective view illustrating a way in which the RF electrode 23 and the heater electrode 130 are disposed.

In a case where the heater electrode 130 is employed instead of the heater electrode 30 in the above embodiment, one (the second heater zone electrode 132 in FIG. 8) of the first and second heater zone electrodes 131 and 132 may be disposed in a gap G between the first and second RF zone electrodes 24 and 25 when the ceramic substrate 22 is viewed from the wafer placing surface 22a, as illustrated in FIG. 8. In a case where applied RF electric power is large, making the gap G large can suppress RF interference and is therefore advantageous but sometimes decreases a plasma density in a part of the gap G in which no RF electrode is present, thereby making an in-plane plasma density uneven. In view of this, by disposing one of the heater zone electrodes 131 and 132 in the region of the gap G, a variation in film formation properties that occurs due to unevenness in plasma density can be compensated and adjusted by adjustment of a temperature distribution, i.e., a heater temperature, and therefore this configuration is effective.

Figure 9:
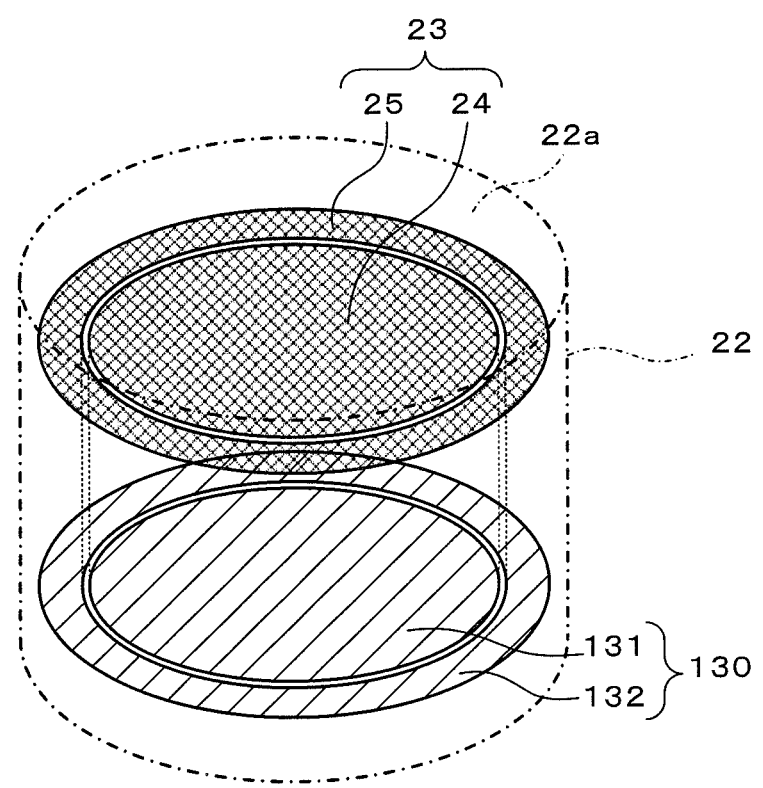
FIG. 9 is a perspective view illustrating a way in which the RF electrode 23 and the heater electrode 130 are disposed.

Alternatively, in a case where the heater electrode 130 is employed instead of the heater electrode 30 in the above embodiment, the first RF zone electrode 24 may match the first heater zone electrode 131 and the second RF zone electrode 25 may match the second heater zone electrode 132 when the ceramic substrate 22 is viewed from the wafer placing surface W, as illustrated in FIG. 9. With the configuration, temperatures of the RF zone electrodes 24 and 25 can be individually controlled by the corresponding heater zone electrodes 131 and 132, respectively.

Figure 10:
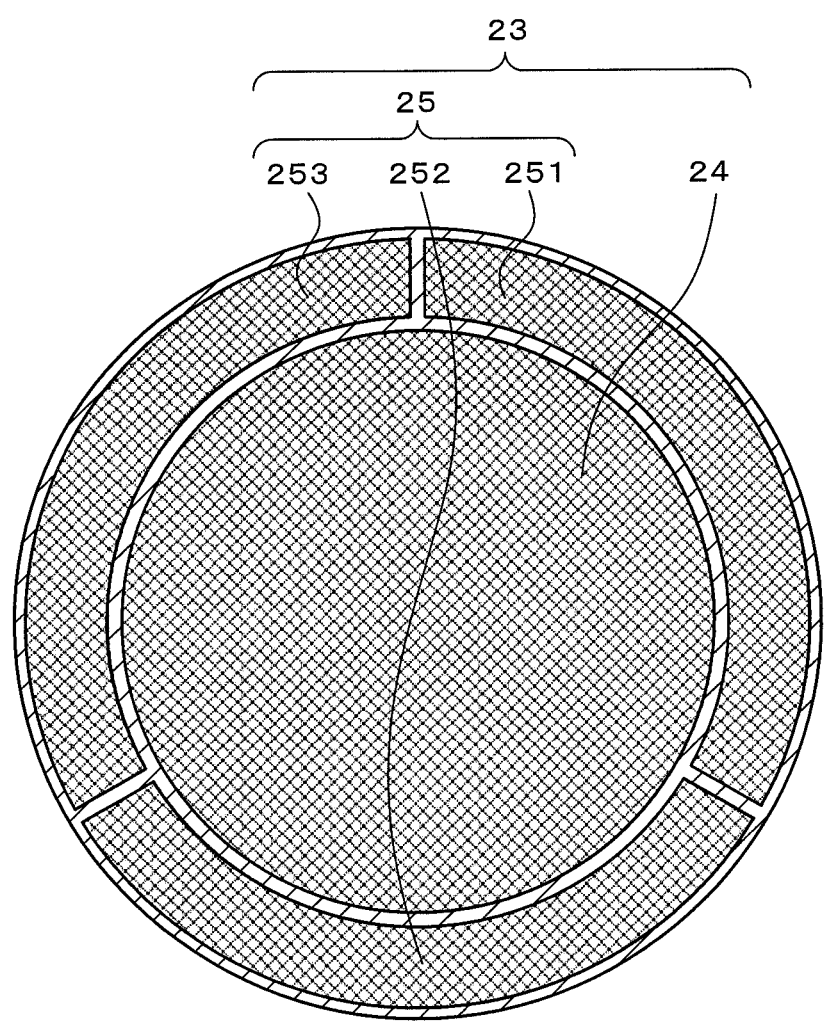
FIG. 10 is a plan view illustrating another example of the RF electrode 23.
Figure 11:
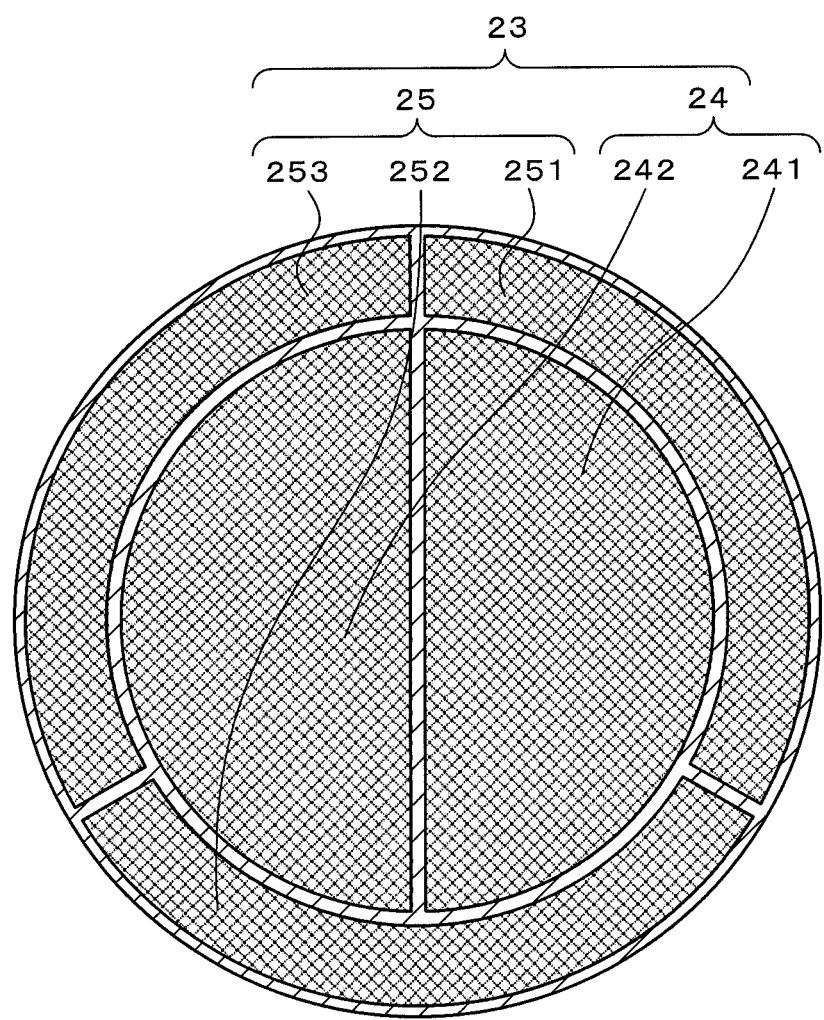
FIG. 11 is a plan view illustrating another example of the RF electrode 23.

Although the RF electrode 23 is constituted by the first RF zone electrode 24 that is a circular electrode and the second RF zone electrode 25 that is an annular electrode in the above embodiment, the second RF zone electrode 25 that is an annular electrode may be divided into a plurality of electrodes to each of which an alternating-current power source is individually connected or the first RF zone electrode 24 that is a circular electrode may be divided into electrodes to each of which an alternating-current power source is individually connected. This makes it possible to easily control a plasma density distribution so that the plasma density distribution further becomes better. FIG. 10 illustrates a case where the second RF zone electrode 25 that constitutes the RF electrode 23 is divided into three arc-shaped electrodes 251 through 253. FIG. 11 illustrates a case where the second RF zone electrode 25 that constitutes the RF electrode 23 is divided into three arc-shaped electrodes 251 through 253 and the first RF zone electrode 24 is divided into two semi-circular electrodes 241 and 242.

Figure 12:
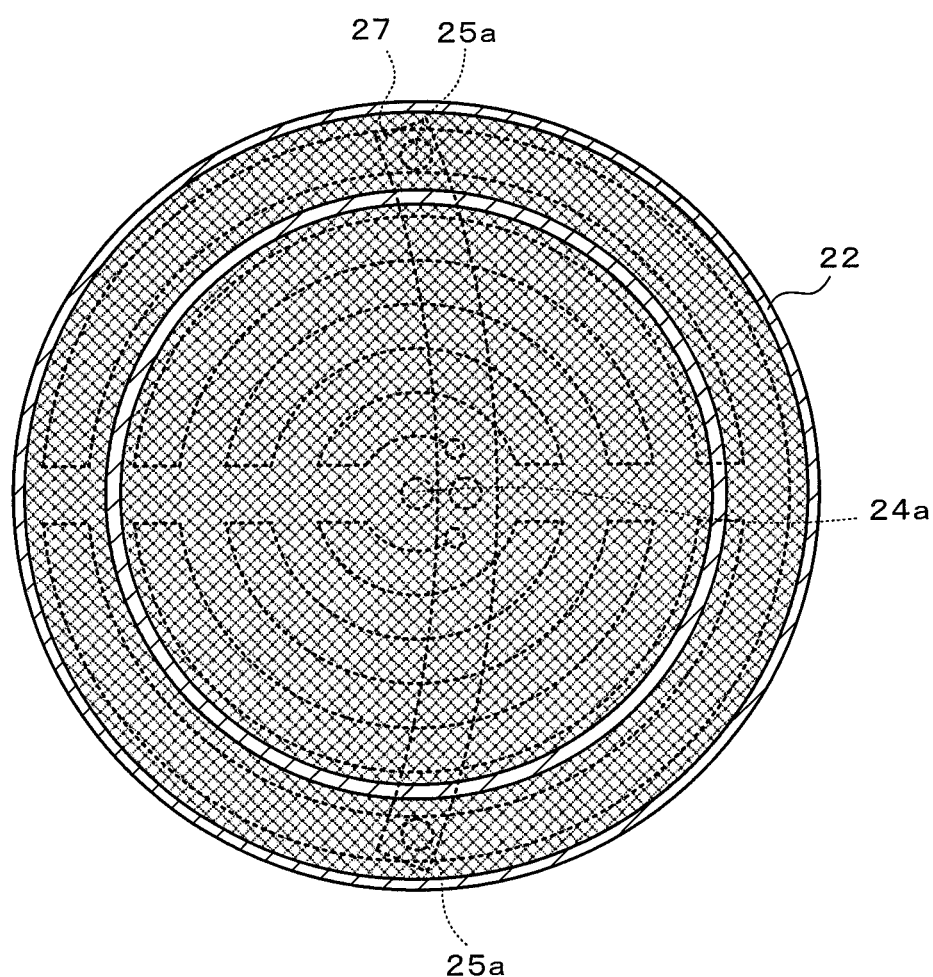
FIG. 12 is a cross-sectional view illustrating another example of the jumper 27.

Although the two inner terminals 25a that connect the second RF zone electrode 25 and the jumper 27 are provided at positions slightly deviated from the diameter of the ceramic substrate 22 in the above embodiment, the two inner terminals 25a may be provided on the diameter of the ceramic substrate 22. In this case, as illustrated in FIG. 12, the jumper 27 need just be curved so that the jumper 27 does not interfere with the electrode terminal 24a.

Although the second RF zone electrode 25 and the jumper 27 are connected through the inner terminals 25a in the above embodiment, the second RF zone electrode 25 and the jumper 27 may be connected through a single inner terminal 25a. This makes it possible to make a length of the jumper 27 similar to the radius of the ceramic substrate 22 (make the length of the jumper 27 short).

Although each of the first and second RF zone electrodes 24 and 25 and the jumper 27 is an electrically-conductive mesh sheet in the above embodiment, each of the first and second RF zone electrodes 24 and 25 and the jumper 27 is not limited to a mesh sheet in particular and may be, for example, a sheet (e.g., a metal foil) having uniform electric conductivity.

In the above embodiment, the wafer W may be sucked onto the wafer placing surface 22a by applying a voltage to the RF electrode 23. Furthermore, the wafer W may be sucked onto the wafer placing surface 22a by further burying an electrostatic electrode in the ceramic substrate 22 and applying a voltage to the electrostatic electrode.

Although an example of a method for manufacturing the wafer support table 20 has been described in the above embodiment, a method for manufacturing the wafer support table 20 is not limited to this in particular, and the wafer support table 20 may be manufactured by another known manufacturing method. For example, the wafer support table 20 may be manufactured according to the manufacturing method described in Japanese Unexamined Patent Application Publication No. 2012-89694.

What is claimed is:

1. A wafer support table, which comprises an RF electrode and a heater electrode buried inside a circular-plate-shaped ceramic substrate, which has a center, having a wafer placing surface in this order from a wafer placing surface side, wherein
   the RF electrode is constituted by a plurality of RF zone electrodes provided in respective zones on an identical plane, and
   the plurality of RF zone electrodes and the heater electrode are independently connected to a plurality of conductors for RF zone electrode and a conductor for heater electrode, respectively, and the plurality of conductors for RF zone electrode and the conductor for heater electrode are provided on an outer side of a surface of the ceramic substrate opposite to the wafer placing surface, and at least one of the plurality of RF zone electrodes is provided outside of a central region in which a hollow ceramic shaft is projected onto the ceramic substrate such that the heater is constituted by a same number of plural heater zone electrodes as the number of RF zone electrodes or a different number of plural heater zone electrodes from the number of RF zone electrodes and the conductor for heater electrode is constituted by conductors for heater zone electrode independently connected to the respective plural heater zone electrodes so that at least one of the heater zone electrodes is disposed in a gap between the RF zone electrodes when the ceramic substrate is viewed from the wafer placing surface and the at least one of the plurality of RF zone electrodes is connected to a corresponding one of the plurality of conductors for RF zone electrode, which is not at the center of the ceramic substrate, in the central region of the ceramic substrate via a rectangular band-shaped jumper having an extending direction that extends outwardly from the corresponding one of the plurality of conductors for RF zone electrode in a linear direction that is parallel to a radial direction from the center of the ceramic substrate, wherein the rectangular band-shaped jumper is provided on a plane parallel with the wafer placing surface so as to be adjacent to and extend in parallel to a radial direction from the center of the ceramic substrate when viewed from the wafer placing surface.

2. The wafer support table according to claim 1, wherein the plurality of RF zone electrodes includes a circular electrode that is concentric with the ceramic substrate or includes the circular electrode that is divided and further includes one or more annular electrodes that are concentric with the ceramic substrate and are provided on a circumference of the circular electrode or includes the one or more annular electrodes that have at least one of the annular electrodes that is divided.

3. The wafer support table according to claim 1, further comprising the ceramic shaft joined to a central region of the surface of the ceramic substrate opposite to the wafer placing surface,
   wherein the plurality of conductors for RF zone electrode and the conductor for heater electrode are disposed inside the ceramic shaft; and
   the jumper is provided inside the ceramic substrate on a plane farther away from the wafer placing surface than the plane on which the RF electrodes are provided.

4. The wafer support table according to claim 3, further comprising a plurality of jumpers, wherein
   two or more RF zone electrodes among the plurality of RF zone electrodes are provided outside the central region; and
   the jumpers provided for the respective two or more RF zone electrodes are provided on an identical plane.

5. The wafer support table according to claim 3, wherein the jumper is provided on a plane on which the heater electrode is provided so as not to be in contact with the heater electrode.

6. The wafer support table according to claim 1, wherein the plurality of RF zone electrodes and the plurality of heater zone electrodes are the same number.

* * * * *